United States Patent [19]

Bierhenke et al.

[11] 4,405,707
[45] Sep. 20, 1983

[54] METHOD OF PRODUCING RELIEF STRUCTURES FOR INTEGRATED SEMICONDUCTOR CIRCUITS

[75] Inventors: Hartwig Bierhenke, Grafing; Siegfried Birkle, Hoechstadt an der Aisch; Roland Rubner, Roettenbach, all of Fed. Rep. of Germany

[73] Assignee: Siemens Aktiengesellschaft, Berlin & Munich, Fed. Rep. of Germany

[21] Appl. No.: 284,099

[22] Filed: Jul. 16, 1981

[30] Foreign Application Priority Data

Jul. 23, 1980 [DE] Fed. Rep. of Germany ....... 3027941

[51] Int. Cl.$^3$ ............................................. B05D 3/06
[52] U.S. Cl. ................................. 430/281; 427/43.1; 430/299
[58] Field of Search .............. 427/43.1; 430/270, 281, 430/299

[56] References Cited

U.S. PATENT DOCUMENTS

| 4,004,044 | 1/1977 | Franco et al. | 427/43.1 |
| 4,024,293 | 5/1977 | Hatzakis | 427/43 |
| 4,202,914 | 5/1980 | Havas et al. | 427/43.1 |
| 4,204,009 | 5/1980 | Feng et al. | 427/43.1 |
| 4,268,601 | 5/1981 | Namiki et al. | 430/299 |
| 4,287,297 | 9/1981 | Ishihara et al. | 430/299 |

Primary Examiner—John H. Newsome
Attorney, Agent, or Firm—Hill, Van Santen, Steadman and Simpson

[57] ABSTRACT

Relief structures comprised of double lacquer layers on substrates already having relief structures for integrated semiconductor circuits are produced by applying a lower lacquer layer onto such substrate and which is composed of a material which does not cross-link or decompose due to radiation energy and which has only relatively slight sensitivity at the radiation energy dosage range utilized for structuring; applying an upper lacquer layer onto the lower lacquer layer and which upper layer is thinner relative to the thickness of the lower layer by a factor of at least 2 and is composed of a highly sensitive negative lacquer material; generating desired relief structures in the upper lacquer layer and removing those portions of the lower lacquer which are not covered by the upper negative lacquer layer.

18 Claims, 3 Drawing Figures

METHOD OF PRODUCING RELIEF STRUCTURES FOR INTEGRATED SEMICONDUCTOR CIRCUITS

BACKGROUND OF THE INVENTION

1. Field of the Invention

The invention relates to a method of producing relief structures and somewhat more particularly to a method for producing relief structures comprised of double lacquer layers particularly on substrates already having relief structures for integrated semiconductor circuits wherein high-energy radiation, such as particulate or photon radiation, is utilized for structuring.

2. Prior Art

In order to be able to construct further structure levels on substrates already having relief structures, which are about 1 $\mu$m high, it was heretofore necessary to coat the substrates with a negative resistant material at such a thickness that any steep relief structure edges were covered with the resist material at a sufficient thickness to adequately mask such edges, after irradiation and development, for subsequent etching. Typically, this resulted in lacquer or resist areas of different thicknesses on the substrate whereby the structure edges had the thinnest coating of resist. This caused a two-fold negative influence on the resist structure resolution during irradiation with high energy particles or photons, especially with electrons. Both the electron beam penetrating into such a resist layer and the electron beam significantly back-scattered at the substrate surface materially reduced the resist resolution power with increasing resist layer thicknesses. Accordingly, the limit of a resist layer applied to a planar substrate, which in this case resolved sub-micron structures, is, at least under certain conditions, displaced far into the micron range.

A double lacquer structure for integrated semiconductor circuits and method of producing such structures is suggested in U.S. Pat. No. 4,024,923. With this technique, at least two layers composed of polymers which chemically decompose upon irradiation and which are composed of materials that are so chemically different, that each layer can be developed without the other layer or without the other layer being significantly attacked by a developer for a given layer. The production of the lacquer or resist structures occurs in such a manner that the lacquer structure is irradiated through a mask which reproduces the desired pattern with radiation of a specific energy and intensity. In this manner, beginning with the uppermost polymer layer, all layers are developed in sequence and rinsing occurs after each development step. The uppermost layer is preferably composed of pure polymethyl methacrylate (PMMA), which is a positive lacquer or resist. This known double lacquer structure is utilized in the production of integrated semiconductor circuits for the so-called metal lift-off process and is intended to avoid both an insufficient structure edge coverage and a non-uniform structuring in the sub-micron range.

However, the foregoing known double lacquer structure and method of producing the same has a number of disadvantages. Among such disadvantages are (a) that the upper, positive lacquer layer required is relatively insensitive, (b) different developers or solvents must be utilized for the overall structuring process and this is uneconomical, and (c) the regulation of the development conditions are very critical.

SUMMARY OF THE INVENTION

The inventive process avoids the above prior art disadvantages by applying a double lacquer layer on a substrate, particularly on a substrate already having relief structures for integrated semiconductor circuits thereon, in such a manner that a lower lacquer layer applied directly on the substrate is comprised of a lacquer material which does not cross-link or decompose due to radiation and which has only a relatively slight sensitivity to the radiation dosage range utilized for structuring while the upper layer is thinner, relative to the thickness of the lower lacquer layer, by at least a factor of 2 and is composed of a highly sensitive negative lacquer or resist material; generating desired relief structures in the upper negative lacquer layer; and removing those portions of the lower lacquer layer which are not covered by the upper negative lacquer layer, either by chemical or physical means.

In certain embodiments of the invention, the upper negative lacquer layer is applied at a layer thickness ranging from about 0.1 through 1.0 $\mu$m and the lower lacquer layer is applied at a layer thickness ranging from about 0.2 through 3.0 $\mu$m.

In certain embodiments of the invention, those portions of the lower lacquer layer which are not covered by the negative lacquer mask (utilized in generating desired relief structures in the upper negative lacquer layer), are removed by reactive sputter etching.

In certain embodiments of the invention, those portions of the lower lacquer layer which are not covered by the negative lacquer mask (utilized for generating desired relief structures in the upper negative lacquer layer) are removed substantially simultaneously with the development of the non-irradiated areas of the upper negative lacquer layer.

In certain embodiments of the invention, the upper negative lacquer layer is developed by a developer selected from the group consisting of methylethyl ketone, methylisobutyl ketone, a mixture of methylethyl ketone and ethanol or isopropanol and/or a mixture of methylisobutyl ketone and ethanol or isopropanol.

In certain embodiments of the invention, the lower lacquer layer is composed of a decomposable positive lacquer material which is only somewhat sensitive to particulate or photon radiation.

In certain embodiments of the invention, the upper negative layer has a sensitivity of less than about 5 $\mu$C/cm$^2$ (microcoulombs per square centimeter) and the lower lacquer layer is a positive lacquer which has a sensitivity in the range of about 10 through 100 $\mu$C/cm$^2$.

In certain embodiments of the invention, the lower lacquer layer is comprised of a thermoplastic material which does not cross-link at relatively low radiation rates and which is free of

radicals. Such thermoplastic materials, which are known per se, are preferably selected from the group consisting of polyphenyleneoxide; polyethersulfone; polycarbonate; polymethacrylimide, novolak (a plastic of the resole type, but formed under acid conditions)- diazochinone mixtures; polyolefinsulfones, such as polybutene-1-sulfone and cyclic polyolefinsulfone; polystyrolsulfone; polyalkylmethacrylate, preferably polymethylmethacrylate (PMMA), and copolymers of methylmethacrylate with α-Cl- acrylates or α-CN-acrylates or, methacrylonitrile; copolymers of methacrylate with fluoridated ester compounds; polybenzylmethacrylate; polymethylisopropenyl ketones; polyisobutylenes and copolymers thereof; and α-cyanoethyl-acrylate-α-amidoethylacrylate copolymers.

In certain embodiments of the invention, the upper negative lacquer layer is a per se known material selected from the group consisting of glycidyl methacrylate; copolymers of glycidyl methacrylate (glycidyl acrylate) and a material selected from the group consisting of styrol, ethyl acrylate, epoxied butadiene, isoprene, polyacrylamide, polyvinylchloride, polysiloxane, a cyclic polyisoprene/diazide mixture (KTFR), polystyrol, polyvinylcarbazol, a halogenated polystyrol, polyvinylcarbazol, chlormethylated polystyrol, a cyclic polyisoprene/diazide mixture (KMER), methylmethacrylate-ethyl acrylate-glycidylmethacrylate-terpolymer partially esterified with 2-methacrylic acid (CER).

In certain embodiments of the invention, the upper negative lacquer layer is composed of radiation-reactive preliminary stages of highly heat-resistant polymers, for example, as such are described in German Pat. Nos. 2,308,830 and/or 2,437,348.

The principles of the invention allow one to generate double lacquer layered structures in the sub-micron range on substrates by electron beam, ion beam or x-ray lithography processes, whereby:

(a) a structure image which is true to dimension is guaranteed over the entire surface to be transcribed or to be generally irradiated with an electron or ion beam, especially at relief structure edges up to 1 μm in height, which already exist on the substrate. A requirement for this is that the different distribution of lacquer thicknesses at the edge areas, which naturally occurs during the lacquering operation, does not influence the lacquer resolution, nor do the electrons which are back-scattered from the substrate into lacquer areas having different thicknesses;

(b) only one developer is utilized for structuring the double lacquer layered structure;

(c) the structure edges are covered with an amount of resist material which is sure to suffice for subsequent etching processes; and (d) the resist (lacquer) structure can be produced in a relatively short printing time, ie., with a high substrate throughput.

A special advantage attained by following the principles of the invention is that, after irradiation of the upper negative lacquer layer, the non-irradiated areas of this upper layer and those areas of the lower lacquer layer which are beneath these non-irradiated areas can be dissolved or developed by the same developer. Because of the use of only a single developer for structuring both the negative resist and a decomposable positive resist or a practically radiation-insensitive thermo-plastic material located beneath the negative resist, the inventive process becomes particularly process-simplified and economical.

DESCRIPTION OF PREFERRED EMBODIMENTS

Figure 1:
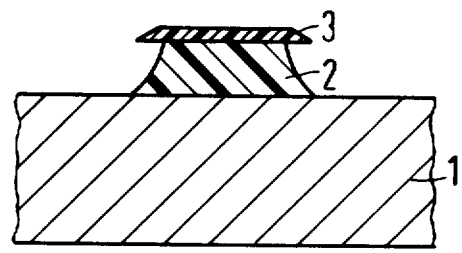
FIG. 1 is a partial, elevated cross-sectional view of an arrangement produced with the principles of the invention in which non-masked upper layer areas were removed by wet-etching.

In order to further illustrate to those skilled in the art the manner in which the invention is practiced, exemplary detailed embodiments are presented below. However, these embodiments are not to be construed as limiting the scope of the invention in any way.

In the drawings, like reference numerals are utilized to identify like elements.

A substrate or wafer 1 is shown as having a lower, relatively thicker lacquer layer 2 on a surface thereof and an upper, relatively thinner, negative lacquer layer 3 on layer 2. The lower lacquer layer 2 preferably is matched to the structures to be generated in terms of thickness and has a layer thickness ranging from about 0.2 through 3 μm, and preferably is about 1 μm. The upper negative layer 3 has a layer thickness ranging from about 0.1 to 1.0 μm and preferably is about 0.2 μm. The sensitivity of the negative lacquer layer 3, which in preferred embodiments is composed of a copolymer of glycidyl methacrylate and styrol, is about 0.4 μC/cm$^2$. The sensitivity of the lower lacquer layer, which in preferred embodiments is composed of polymethylmethacrylate (PMMA) is about 50 μC/cm$^2$.

In the arrangement illustrated at FIG. 1, the removal of the lower lacquer layer 2, after exposure and development of the upper layer 3, occurred by wet etching with an organic solvent, preferably methyl isobutyl ketone or a mixture of methyl isobutyl ketone and ethanol or isopropanol.

Figure 2:
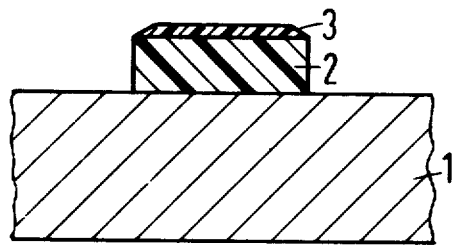
FIG. 2 is a somewhat similar view wherein non-masked upper layer areas were removed by reactive sputter etching.

In the arrangement shown in FIG. 2, removal occurred with a dry etching technique. The uncovered areas of the lower lacquer layer 2, after exposure and development of the upper lacquer layer 3, were removed from the substrate 1 in a plasma reactor utilizing a partial oxygen pressure of 0.7 mbar with an energy of 1000 watts. As can be seen from this figure, an image which is true to dimension, ie., without undercutting of the lacquer mask structures, was obtained with this type of etching.

Figure 3:
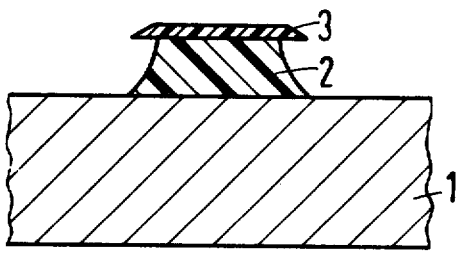
FIG. 3 is a somewhat similar view wherein portions of the lower layer were removed simultaneously with the development of the non-irradiated areas of the upper layer.

The generation of these structures is particularly process-simplified when, as in the arrangement shown in FIG. 3, the non-irradiated areas of the upper layer and the areas of the PMMA layer located below such areas are soluble in the same developer, after the irradiation of the upper negative resist layer 3. Such a developer for this embodiment was methyl ethyl ketone or methyl isobutyl ketone, which, if need be, can be mixed with ethanol or isopropanol.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

We claim as our invention:

1. In a method for producing relief structures comprised of double lacquer layers on substrates which already contain relief structures for integrated semiconductor circuits wherein high-energy radiation, such as particulate or photon radiation, is utilized for structuring, the improvement comprising:

applying said double lacquer layer to said substrate with a lower lacquer layer positioned directly on said substrate and an upper lacquer layer positioned on said lower lacquer layer;

said lower lacquer layer being composed of a decomposable positive lacquer material which is only somewhat sensitive to particulate or photon radiation and having a sensitivity in the range of about 10 through 100 $\mu$m C/cm$^2$;

said upper lacquer layer being thinner relative to the thickness of said lower lacquer layer by at least a factor of 2 and being comprised of a highly sensitive negative lacquer material having sensitive of less than about 5 $\mu$m C/cm$^2$;

generating desired relief structures in said upper negative lacquer layer; and removing those portions of said lower lacquer layer which are not covered by said upper negative lacquer layer.

2. In a method as defined in claim 1 wherein said upper negative lacquer layer is applied at a layer thickness ranging from about 0.1 through 1.0 $\mu$m and said lower lacquer layer is applied in a layer thickness ranging from about 0.2 through 3.0 $\mu$m.

3. In a method as defined in claim 1 wherein generating desired relief structures in said upper negative lacquer layer includes applying a negative lacquer mask onto said upper negative lacquer layer prior to exposure to radiation; and removing those portions of said lower positive lacquer layer which are not covered by said mask are removed substantially simultaneously with development of the non-irradiated areas of said upper negative lacquer layer.

4. In a method as defined in claim 3 wherein said non-irradiated areas of said negative lacquer layer are removed by a developer selected from the group consisting of methyl ethyl ketone, methyl isobutyl ketone, a mixture of methyl ethyl ketone and ethanol or isopropanol and a mixture of methyl isobutyl ketone and ethanol or isopropanol.

5. In a method as defined in claim 1 wherein said lower lacquer layer is composed of material selected from the group consisting of polyphenyleneoxide; polyethersulfone; polycarbonate; polymethacrylimide; novolak/diazochinone mixtures; polyolefinsulfones; polystyrolsulfones; polyalkylmethacrylates; copolymers and methylmethacrylate with a material selected from the group consisting of $\alpha$—Cl— acrylates, $\alpha$—CN— acrylates and methacrylnitrile; copolymers of methacrylate with fluoridated ester compounds; polybenzylmethacrylate; polymethylisopropenyl ketones; polyisobutylenes and copolymers thereof; and $\alpha$-cyanoethylacrylate- $\alpha$-amidoethylacrylate copolymers.

6. In a method as defined in claim 5 wherein said polyolefin sulfones are selected from the group consisting of polybutene-1-sulfone and cyclic polyolefin sulfone.

7. In a method as defined in claim 5 wherein said polyalkylmethacrylate is polymethylmethacrylate.

8. In a method as defined in claim 1 wherein said upper negative lacquer layer is composed of a material selected from the group consisting of glycidyl methacrylate; copolymers of glycidyl methacrylate (glycidyl acrylate) and a material selected from the group consisting of styrol, ethyl acrylate, epoxied butadiene, isoprene, polyacrylamide, polyvinylchloride, polysiloxane, a cyclic polyisoprene/diazide mixture (KTFR), polystyrol, polyvinylcarbazol, a halogenated polystyrol, polyvinylcarbazol, chlormethylated polystyrol, a cyclic polyisoprene/diazide mixture (KMER) methylmethacrylate-ethyl acrylate-glycidymethacrylate-terpolymer, partially esterified with 2-methacrylic acid (CER).

9. In a method as defined in claim 1 wherein said upper negative lacquer layer is composed of radiation-reactive preliminary stages of highly heat-resistant polymers.

10. In a method for producing relief structures comprised of double lacquer layers on substrates which already contain relief structures for integrated semiconductor circuits wherein high-energy radiation, such as particulate or photon radiation, is utilized for structuring, the improvement comprising:

applying said double lacquer layer to said substrate with a lower lacquer layer positioned directly on said substrate and an upper lacquer layer positioned on said lower lacquer layer;

said lower lacquer layer being composed of a thermoplastic material which does not cross-link at relatively low radiation dosage rates and which is free of

radicals;

said upper lacquer layer being thinner relative to the thickness of said lower lacquer layer by at least a factor of 2 and being comprised of a highly sensitive negative lacquer material;

generating desired relief structures in said upper negative lacquer layer; and removing those portions of said lower lacquer layer which are not covered by said upper negative lacquer layer.

11. In a method as defined in claim 10 wherein said upper negative lacquer layer is applied at a layer thickness ranging from about 0.1 through 1.0 $\mu$m and said lower lacquer layer is applied in a layer thickness ranging from about 0.2 through 3.0 $\mu$m.

12. In a method as defined in claim 10 wherein generating desired relief structures in said upper negative lacquer layer includes applying a negative lacquer mask onto said upper negative lacquer layer prior to exposure to radiation; and removing those portions of said lower lacquer layer which are not covered by said mask substantially simultaneously with development of the non-irradiated areas of said upper negative lacquer layer.

13. In a method as defined in claim 10 wherein said non-irradiated areas of said negative lacquer layer are removed by a developer selected from the group consisting of methyl ethyl ketone, methyl isobutyl ketone, a mixture of methy ethyl ketone and ethanol or isopropanol and a mixture of methyl isobutyl ketone and ethanol or isopropanol.

14. In a method as defined in claim 10 wherein said lower lacquer layer is composed of material selected from the group consisting of polyphenyleneoxide; polyethersulfone; polycarbonate; polymethacrylimide; novolak/diazochinone mixtures; polyolefinsulfones; polystyrolsulfones; polyalkylmethacrylates; copolymers and methylmethacrylate with a material selected from the group consisting of α—Cl— acrylates, α—CN—acrylates and methacrylnitrile; copolymers of methacrylate with fluoridated ester compounds; polybenzylmethacrylate; polymethylisopropenyl ketones; polyisobutylenes and copolymers thereof; and α-cyanoethylacrylate-α-amidoethylacrylate copolymers.

15. In a method as defined in claim 14 wherein said polyolefin sulfones are selected from the group consisting of polybutene-1-sulfone and cyclic polyolefin sulfone.

16. In a method as defined in claim 14 wherein said polyalkylmethacrylate is polymethylmethacrylate.

17. In a method as defined in claim 10 wherein said upper negative lacquer layer is composed of a material selected from the group consisting of glycidyl methacryalate; copolymers of glycidyl methacryalate (glycidyl acrylate) and a material selected from the group consisting of styrol, ethyl acrylate, opoxied butadiene, isoprene, polyacrylamide, polyvinylchloride, polysiloxane, a cyclic polyisoprene/diazide mixture (KTFR), polystyrol, polyvinylcarbazol, a halogenated polystyrol, polyvinylcarbazol, chlormethylated polystyrol, a cyclic polyisoprene/diazide mixture (KMER) methylmethacrylate-ethyl acrylate-glycidymethacrylate-terpolymer, partially esterified with 2-methacrylic acid (CER).

18. In a method as defined in claim 10 wherein said upper negative lacquer layer is composed of radiation-reactive preliminary stages of high heat-resistant polymers.

* * * * *